US007015585B2

(12) United States Patent
Downey et al.

(10) Patent No.: US 7,015,585 B2
(45) Date of Patent: Mar. 21, 2006

(54) PACKAGED INTEGRATED CIRCUIT HAVING WIRE BONDS AND METHOD THEREFOR

(75) Inventors: Susan H. Downey, Austin, TX (US); Sheila F. Chopin, Austin, TX (US); Peter R. Harper, Round Rock, TX (US); Sohrab Safai, Round Rock, TX (US); Tu-Anh Tran, Austin, TX (US); Alan H. Woosley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 19 days.

(21) Appl. No.: 10/323,296

(22) Filed: Dec. 18, 2002

(65) Prior Publication Data

US 2004/0119168 A1 Jun. 24, 2004

(51) Int. Cl.
*H01L 23/48* (2006.01)

(52) U.S. Cl. .............. 257/774; 257/773; 257/776; 257/662; 257/663; 257/690; 257/678; 257/786

(58) Field of Classification Search .......... 257/774, 257/773, 776, 662, 663, 690, 678, 786
See application file for complete search history.

(56) References Cited

U.S. PATENT DOCUMENTS

| 5,006,673 | A | | 4/1991 | Freyman |
| 5,592,025 | A | | 1/1997 | Clark |
| 6,103,548 | A | | 8/2000 | Miks |
| 6,291,898 | B1 | * | 9/2001 | Yeh et al. ............... 257/786 |
| 6,449,169 | B1 | * | 9/2002 | Ho et al. ............... 361/762 |
| 6,542,377 | B1 | * | 4/2003 | Fisher et al. ........... 361/777 |
| 6,582,979 | B1 | * | 6/2003 | Coccioli et al. ......... 438/25 |
| 6,703,698 | B1 | * | 3/2004 | Huang et al. ........... 257/678 |
| 2003/0082845 | A1 | * | 5/2003 | Hoffman et al. |

FOREIGN PATENT DOCUMENTS

WO   WO 98/26452   6/1998

OTHER PUBLICATIONS

Chopin et al., "Substrate and Assembly Manufacturing Key Enablers to Achieve Finer Pitch Wire Bonded Ball Grid Arrays," 2000 International Symposium on Microelectronics, pp. 675-677.
Mosko et al., "High Performance MCM-L Package for Digital Processing Applications," IEEE 1997 International Conference on Multichip Modules, pp. 59-63.

* cited by examiner

*Primary Examiner*—Stephen Loke
*Assistant Examiner*—Junghwa Im
(74) *Attorney, Agent, or Firm*—James L. Clingan, Jr.; Susan C. Hill; Robert L. King

(57) ABSTRACT

An integrated circuit is packaged using a package substrate that has a bottom side with a regular array of connection points and a top side with the integrated circuit on it. The package substrate also has vias that are present to provide electrical connection between the top and bottom sides. The vias have a via capture pad that is used to directly receive a wire bond. Thus, the wires from the integrated circuit to the top side directly contact the vias at their capture pads. In such a connection there is then no need for a trace from location where the wire is bonded on the top side to the via. This saves cost. Further this makes the package substrate useful for more than one type of integrated circuit.

8 Claims, 2 Drawing Sheets

PACKAGED INTEGRATED CIRCUIT HAVING WIRE BONDS AND METHOD THEREFOR

FIELD OF THE INVENTION

This invention relates to packaged integrated circuits, and more particularly, to integrated circuits that are packaged and have wire bonds.

RELATED ART

Ball grid array (BGA) is an important package type for integrated circuits that typically uses wire bonds in making electrical connection between the integrated circuit and the exterior of the package. BGA packages generally have an integrated circuit mounted on a top side of a package substrate and have an array of solder balls on the bottom side of the package substrate. The top side has metal traces that connect wire bond fingers to via capture pads, which are part of the vias, that further in turn connect to the solder balls on the bottom side. The wire bond fingers are for making contact to the wire that is wire bonded to the integrated circuit. Thus, typically, the integrated circuit makes electrical contact to the via by a wire from an IC bond pad on the integrated circuit that is wire bonded to the wire bond finger that in turn is connected to a trace that in turn is connected to the via capture pad of the via.

BGA packages are particularly beneficial for high performance integrated circuits in which low cost is significant. This applies to many integrated circuits such as microcomputers and static random access memories (SRAMs).

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

An integrated circuit is packaged using a package substrate that has a bottom side with a regular array of connection points and a top side with the integrated circuit on it. The package substrate also has vias that are present to provide electrical connection between the top and bottom sides. The vias have a via capture pad that is used to directly receive a wire bond. Thus, the wires from the integrated circuit to the top side of the substrate directly contact the vias at their capture pads. In such a connection there is then no need for a trace from the location where the wire is bonded on the top side to the via. This saves cost. Further this makes the package substrate useful for more than one type of integrated circuit.

Figure 1:
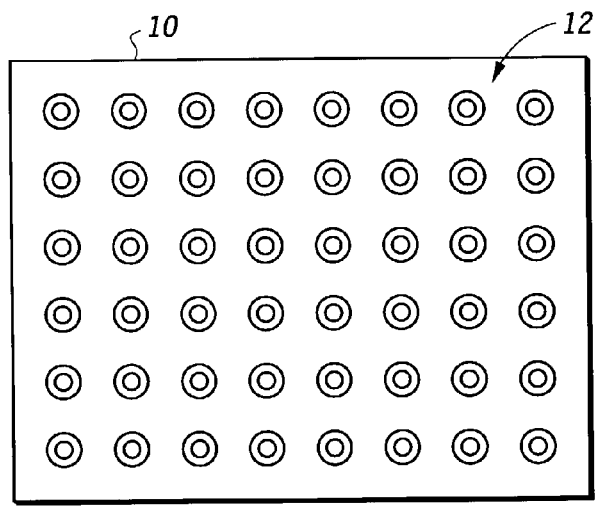
FIG. 1 is a top view of a package substrate useful in the packaging of an integrated circuit according to one embodiment of the invention.

Shown in FIG. 1 is a package substrate 10 made of circuit board material having a plurality of vias. The vias are arranged in a regular array, in this case, a 6×8 array. This FIG. 1 shows the top side of package substrate 10.

Figure 2:
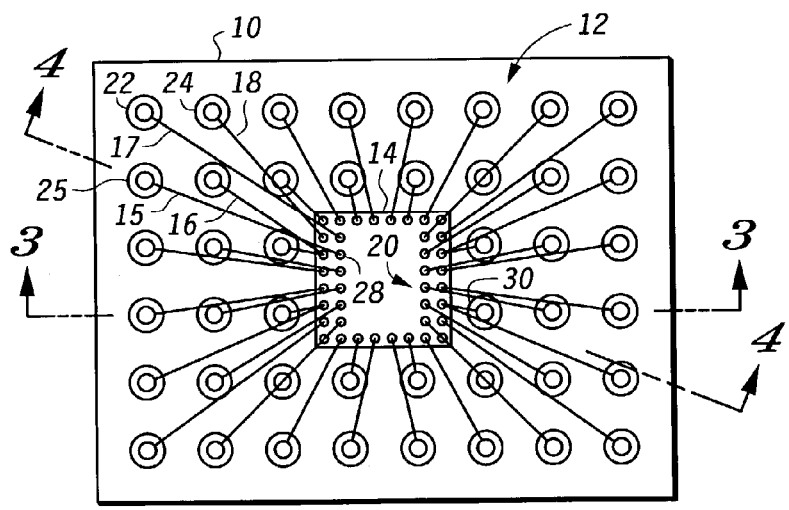
FIG. 2 is a top view of the package substrate of FIG. 1 with an integrated circuit mounted thereon according to the one embodiment of the invention.

Shown in FIG. 2 is package substrate 10 with an integrated circuit 14, which has IC pads 20, that is mounted on the top side of package substrate 10. IC pads 20 are wire bonded to vias 12. Exemplary wires that are wire bonded between integrated circuit 14 and vias 12 comprise wires 15, 16, 17, and 18. Exemplary vias comprise 22, 24, and 25, which are directly wire bonded to wires 17, 18, and 15, respectively, without requiring traces. Thus, integrated circuit 14 is coupled to vias 12 by traceless conductors. Shown here is that wires 15 and 16 cross and wires 17 and 18 cross. Wires 15–18 are insulated in this described embodiment so that crossing is permitted. Insulated wires may be beneficial, even though more expensive than bare wire, for any application because it may allow for a larger diameter wire, such as one having a diameter greater than 25.5 microns, which is a lower resistance than is typical. The lower resistance can reduce the adverse effects associated with the resistance of wires used in wire bonding. A preferred technique for obtaining such insulated wires is described in U.S. patent application Ser. No. 10/323,293 filed on even date herewith and incorporated by reference herein.

An alternative to having wires 15–18 being insulated is to allow for varying loop heights and profiles for the wires. Wire bonding equipment does allow for this option. In this example, there is a one to one correspondence between via and IC pad, but an alternative is for more than one IC pad to be wire bonded to the same via. This is particularly common with IC pads that receive a power supply. The vias, as is common with vias, have a surface that is exposed on the top side of substrate 10. This exposed portion, a via capture pad portion of the via, is made to have a surface to which a wire bond can be made. Examples of such surface are gold, silver, palladium, copper, and aluminum. Other materials may also be effective. In prior art designs, the bond pad finger is treated in the manner necessary for receiving a wire bond. In FIG. 2, the via capture pad portion of the via is treated in this way. Thus, any of the current techniques used for preparing a bond pad finger should be effective for treating the via capture pad portion.

IC pads 20 can be any common IC pad that is capable of being wire bonded. The placement of the IC pads in integrated circuit 14 is in the periphery but could be in any other location. Integrated circuit 14, as any integrated circuit, has an active portion where transistors are present. IC pads 20 may be over this active portion or over areas that are not part of the active portion. There may be a benefit of having at least some of the IC pads over the active portion because of the flexibility of placing the pads, which may result in no wires crossing over. This may allow not having to use insulated wires or altering the wire height.

Figure 3:
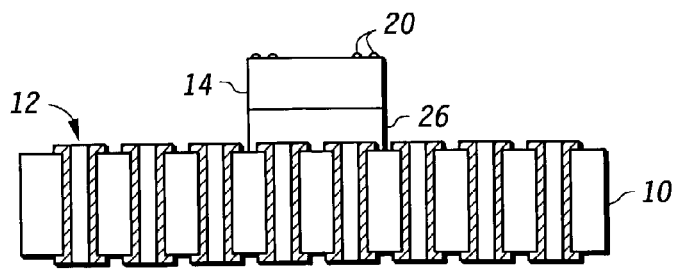
FIG. 3 is a cross section of the package substrate of FIG. 2 taken at one location.

Shown in FIG. 3 is a cross section taken at 3—3 of substrate 10 and eight of plurality of vias 12 with integrated circuit 14 overlying package substrate 10. Also shown is a die attach material 26 for attaching integrated circuit 14 to package substrate 10. This die attach material may be either an insulating material or conductive. If the vias under integrated circuit 14 are supplying a ground connection, there is a benefit for the die attach material to be conductive. Also the die attach material being conductive may be useful for thermal conduction. Further shown on integrated circuit 14 are IC pads 20. In this cross section wires for the wire bonds are not shown because they would simply be a cross section of the wire.

Figure 4:
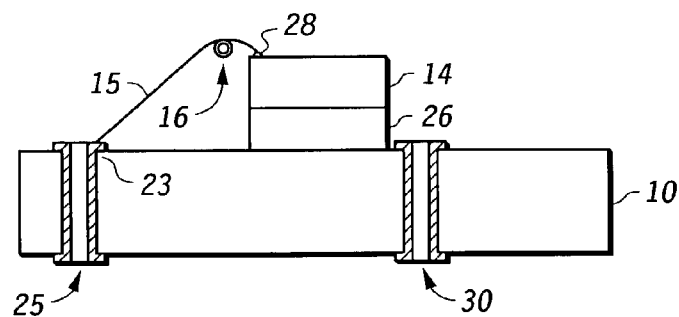
FIG. 4 is a cross section of the package substrate of FIG. 2 taken at another location.

Shown in FIG. 4 is a cross section taken at 4—4 of substrate 10 along wire 15. This shows wire 15 wire bonded between an IC pad 28 of IC pads 20 and a via capture pad portion 23 of via 25. This shows that wire 15 is in direct contact with via 25 through via capture portion 23. Also shown is via 30. Vias 25 and 30 are also shown in FIG. 2.

Figure 5:
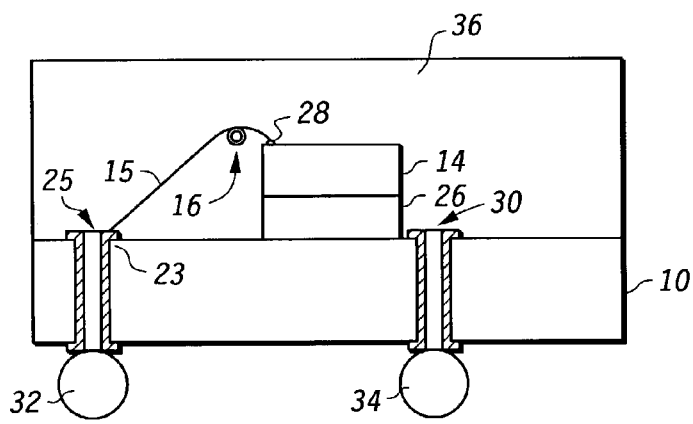
FIG. 5 is the cross section of FIG. 4 after adding molding compound and solder balls to complete a packaged integrated circuit.

Shown in FIG. 5 is substrate 10 as shown in FIG. 4 after application of molding compound 36 and solder balls 32 and 34. This provides for a completed packaged integrated circuit. The application of solder balls may not be required for an application using a land grid array (LGA) type of package. In such a case the contacts on the bottom side are in an array (equally spaced in the row direction and equally spaced in the column direction but not necessarily the same spacing in the row and column direction) but electrical contact is made with a pad rather than solder balls. A portion of the array of electrical contact pads on the bottom side of substrate 10 may be missing a portion under the likely area for an integrated circuit and still be considered an array.

Figure 6:
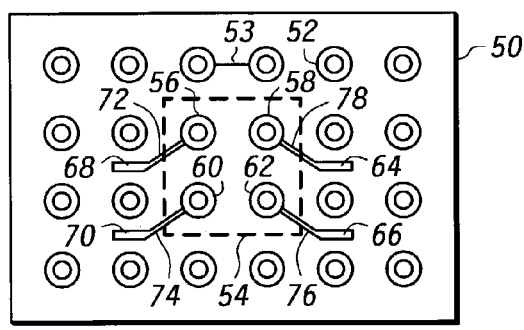
FIG. 6 is a top view of a package substrate according to another embodiment of the invention.

Shown in FIG. 6 is a substrate 50 with an array of vias 52 showing an alternative to substrate 10 of FIGS. 1–5. In this alternative there are vias that have traces connected to them. In this case vias 56, 58, 60, and 62 are connected to wire bond fingers 68, 64, 70, and 66, respectively, by way of traces 72, 78, 74, and 76. Also shown in FIG. 6 is an outline, in dotted lines, of a potential integrated circuit 54 that overlies vias 56, 58, 60, and 62. The traces 72, 74, 76, and 78 thus provide for the opportunity for connection to the via locations under integrated circuit 54. Thus, most of the vias would be connected to the integrated circuit by traceless conductors but a few would be connected through traces. Also shown in FIG. 6 is a wire 53 connected directly between two vias. This can be particularly useful in connecting power supply voltages, such as Vdd and ground.

Figure 7:
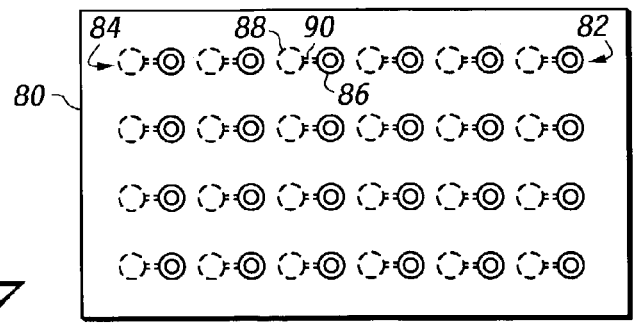
FIG. 7 is a top view of a package substrate according to yet another embodiment of the invention.

Shown in FIG. 7 is a top side of a package substrate 80 shown having an array of vias 82 connected to an array of solder pad locations 84 on the bottom side of substrate 80. The bottom side features are shown with dotted lines. Connecting solder pad locations 84 and vias 82 is by traces between them on the bottom side. An example is a via 86 for receiving a wire bond on the top side and connected to solder pad 88 on the bottom side by way of trace 90 on the bottom side. In this example, both the vias and the solder pad locations are in an array but it is not essential that the vias be in an array. There may be a benefit to having the vias arranged in more radial fashion to make it easier to avoid wire crossing. The top side, thus, would provide for traceless conductors between the vias, which may or may not be in an array, and the IC pads on the integrated circuit that would be mounted on the top side of substrate 80. The bottom side, on the other hand, would provide for an array of contact pads, such as solder pads 84, that are connected by traces to vias 82. A benefit of this would be the ability to use the offset via approach for the solder ball connection while retaining the benefits of a traceless top side.

These embodiments provide a substantial cost benefit of either eliminating or greatly reducing top side traces and bond fingers. Particularly in high density applications, such top side traces and bond fingers require special processing etching for small line and space geometry. So the savings is particularly significant for those applications. Also the space available for routing of the traces can be limited and the traces under the integrated circuit must be insulated from the integrated circuit with a solder mask. Thus, the elimination of the traces prevents these costs completely and reducing the traces reduces the costs and substantially achieves commensurate reduction in complexity. The reduction in complexity should result in improved yield and design density.

Another benefit is the opportunity to use the same substrate for many different integrated circuit sizes and designs. The package substrates are generally made in sheets much larger than for a single integrated circuit. For substrate 80 as shown in FIG. 7 and substrate 10 of FIG. 1, these can be cut from a sheet of a very large array of vias, and in the case of FIG. 7, contact pads. Thus, regardless of the size of the integrated circuit, this array can be used. In the case of substrate 50 of FIG. 6, where there are traces for some of the vias, there may be some level of repeatability for integrated circuits of comparable size. In typical prior art BGAs, it is common for some contact pads on the bottom to not be connected to vias because those contacts are not needed. Thus these are not reusable for other integrated circuits even if they are of comparable size. This universal use aspect can be a significant cost benefit because of the reduced nonrecurring engineering costs and inventory costs. Further is the benefit of the speed with which a new integrated circuit can be properly packaged. The BGA sheet can be simply wired bonded to the IC and cut to size. Also defects on a BGA sheet of a continuous array would have a reduced impact on the amount of the sheet that is unusable. If any portion of a site has a defect for a site that is dedicated to a single integrated circuit, then that whole site is unusable, regardless of how much of the site is not defective. A BGA sheet of continuous array could use a simple sorting method during inspection at the substrate supplier to identify high and low defect density sheets. Higher defect density sheets would have improved sheet area utilization when assembled with a integrated circuits using smaller package footprints, compared to integrated circuits on large package substrates.

Another issue with traces is that they sometimes crack under temperature stresses. The elimination or reduction in traces correspondingly eliminates or reduces this problem of traces cracking, thus improving yield. By reducing the quantity of traces and freeing up available routing channel, the remaining traces can be designed at wider widths. Fewer but wider traces reduces the problem of trace cracking, thus improving the package substrate reliability.

In the foregoing specification, the invention has been described with reference to specific embodiments. However, one of ordinary skill in the art appreciates that various modifications and changes can be made without departing from the scope of the present invention as set forth in the claims below. For example, vias of a type other than the one specifically shown may be used instead. For example, other vias that may be used are a blind via, filled via, punched via, laser via, etched via, and build-up via as well as other types of vias. Also, the pads are shown as circular but other shapes may also be effective. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit on a package substrate, comprising:
    a first integrated circuit pad on the integrated circuit;
    a first via in the package substrate;
    a first wire having a first end bonded to the first integrated circuit pad and having a second end bonded directly to the first via, wherein neither a wire bond finger nor a trace is interposed between the second end of the first wire and the first via and wherein the first wire comprises an outer insulating layer;
    a second integrated circuit pad on the intergrated circuit;
    a second via in the package substrate;
    a second wire having a first end bonded to the second integrated circuit pad and having a second end bonded directly to the second via, wherein neither a wire bond finger nor a trace is interposed between the second end of the second wire and the second via, and wherein the first wire crosses the second wire; and
    a molding compound encapsulating the first wire, the second wire, the first via, the second via, the first intergrated circuit pad, and the second intergrated circuit pad.

2. An integrated circuit on a package substrate as in claim 1, wherein the first via comprises a via capture pad portion, and wherein the second end of the first wire is bonded to the via capture pad portion of the first via.

3. An integrated circuit on a package substrate as in claim 2, wherein a shape of the via capture pad portion is circular from a top view.

4. An integrated circuit on a package substrate as in claim 1, wherein the package substrate is a ball grid array (BGA) substrate.

5. An integrated circuit on a package substrate as in claim 1, wherein a diameter of the first wire is greater than 25.5 microns.

6. An integrated circuit on a package substrate as in claim 1, wherein at least one of said first integrated circuit pad and said second integrated circuit pad overlies active circuit area on the integrated circuit.

7. An integrated circuit on a package substrate, comprising:
    a first plurality of integrated circuit pads on the integrated circuit;
    a first plurality of vias in the package substrate;
    a first plurality of wires, wherein each one of the first plurality of wires has a first end bonded to one of the first plurality of integrated circuit pads and has a second end bonded directly to one of the first plurality of vias with neither a trace nor a wire bond finger interposed therebetween, wherein the first plurality of wires cross each other, and wherein the first plurality of wires are characterized as comprising an insulating layer; and
    a molding compound encapsulating the first plurality of intergrated circuit pads, the first plurality of vias, and the first plurality of wires.

8. An integrated circuit on a package substrate as in claim 7, wherein the second end of at least two of the first plurality of wires can be bonded directly to a same one of the first plurality of vias.

* * * * *